United States Patent
Shiraishi

(10) Patent No.: US 10,490,222 B2
(45) Date of Patent: Nov. 26, 2019

(54) SIGNAL QUALITY EVALUATION DEVICE, SIGNAL QUALITY EVALUATION VALUE GENERATION METHOD, AND REPRODUCTION DEVICE

(71) Applicant: SONY SEMICONDUCTOR SOLUTIONS CORPORATION, Kanagawa (JP)

(72) Inventor: Junya Shiraishi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/324,206

(22) PCT Filed: Jun. 12, 2017

(86) PCT No.: PCT/JP2017/021684
§ 371 (c)(1),
(2) Date: Feb. 8, 2019

(87) PCT Pub. No.: WO2018/042814
PCT Pub. Date: Mar. 8, 2018

(65) Prior Publication Data
US 2019/0172489 A1 Jun. 6, 2019

(30) Foreign Application Priority Data
Aug. 30, 2016 (JP) .................. 2016-168028

(51) Int. Cl.
*G11B 20/10* (2006.01)
*H03M 13/41* (2006.01)
*G11B 20/18* (2006.01)

(52) U.S. Cl.
CPC .. *G11B 20/10361* (2013.01); *G11B 20/10009* (2013.01); *G11B 20/10305* (2013.01); *G11B 20/18* (2013.01); *H03M 13/41* (2013.01)

(58) Field of Classification Search
CPC . G11B 20/025; G11B 20/18; G11B 20/10037; G11B 2020/10583; G11B 20/10046; G11B 20/10055; G11B 27/3027
USPC ......... 369/53.35, 59.15, 59.21, 59.22, 59.26, 369/59.27
See application file for complete search history.

(56) References Cited

U.S. PATENT DOCUMENTS

2011/0149704 A1* 6/2011 Miyashita ........ G11B 20/10009
369/53.11

* cited by examiner

*Primary Examiner* — Nabil Z Hindi
(74) *Attorney, Agent, or Firm* — Paratus Law Group, PLLC

(57) ABSTRACT

To obtain a signal quality evaluation value capable of having a high correlation to an error rate and high accuracy for a reproduction signal of high density recording. For the object, an estimated value of a path selection error rate is obtained on the basis of a distribution of a path metric difference between a maximum likelihood path at each time, which is a detection path in maximum likelihood decoding in a PRML decoding system and a second path having a second highest likelihood. Further, an average error bit number in erroneous detection is obtained from a bit difference number between the maximum likelihood path and the second path at the time of path selection of each time in the maximum likelihood decoding. In addition, an estimated bit error rate is obtained from results and an evaluation value according to the estimated bit error rate is generated.

7 Claims, 12 Drawing Sheets

FIG. 2
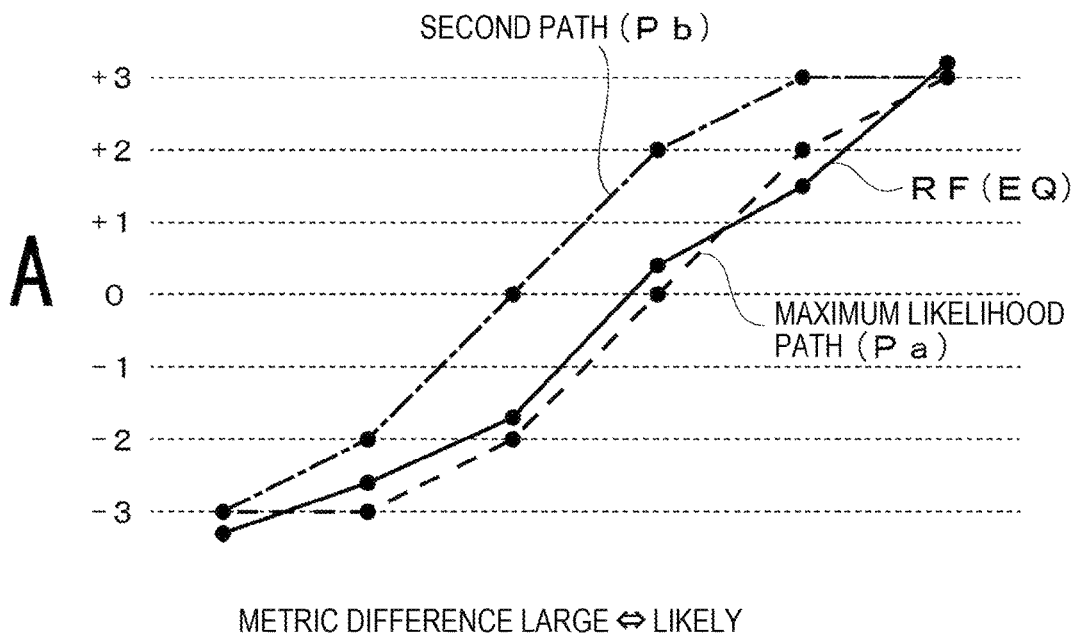
A
METRIC DIFFERENCE LARGE ⇔ LIKELY
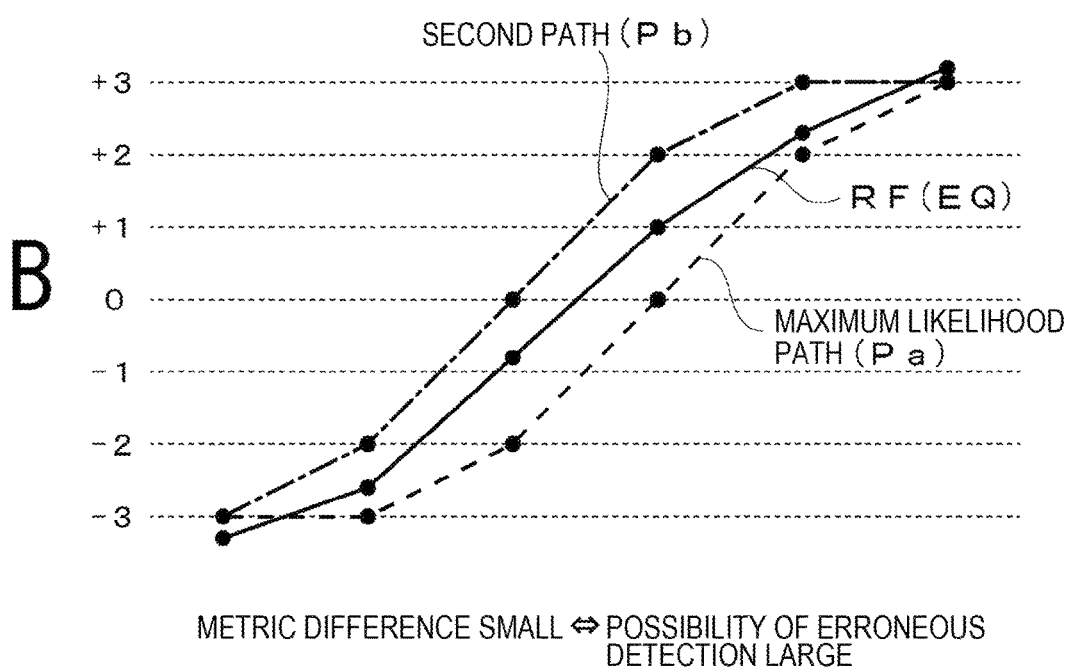
B
METRIC DIFFERENCE SMALL ⇔ POSSIBILITY OF ERRONEOUS DETECTION LARGE

FIG. 4
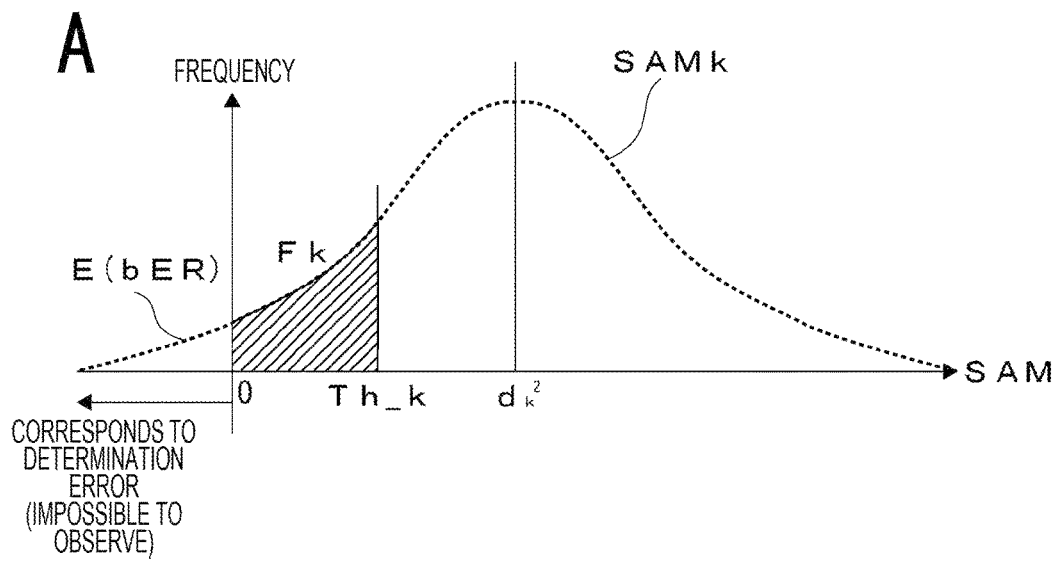
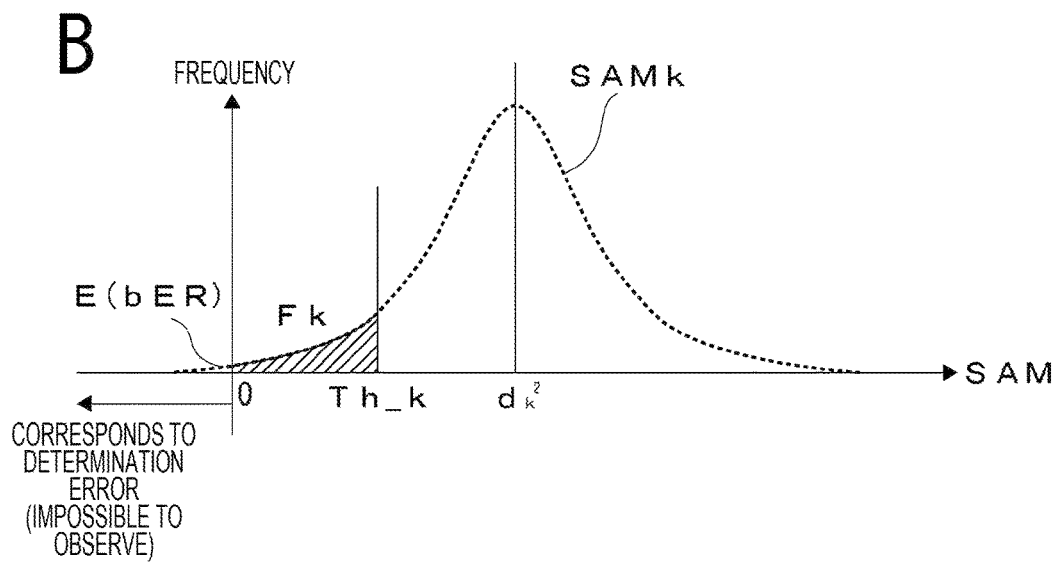

FIG. 5

ERROR PATTERNS OF PR (3, 6, 9, 13, 16, 17, 16, 13, 9, 6, 3)

| PATTERN NUMBER | SQUARED EUCLIDEAN DISTANCE | HAMMING DISTANCE | ERROR PATTERN ("1" IS ERROR BIT POSITION) |
|---|---|---|---|
| 1 | 270 | 6 | ... |
| 2 | 292 | 12 | ... |
| 3 | 294 | 10 | ... |
| 4 | 300 | 12 | ... |
| 5 | 306 | 14 | ... |
| 6 | 310 | 10 | ... |
| 7 | 314 | 14 | ... |
| 8 | 324 | 12 | ... |
| 9 | 336 | 6 | ... |
| 10 | 344 | 12 | ... |
| 11 | 348 | 8 | ... |
| 12 | 348 | 8 | ... |
| 13 | 348 | 12 | ... |
| 14 | 352 | 14 | ... |
| 15 | 352 | 14 | ... |
| 16 | 354 | 10 | ... |
| 17 | 354 | 10 | ... |
| 18 | 356 | 8 | ... |
| 19 | 358 | 10 | ... |
| 20 | 360 | 12 | ... |
| 21 | 362 | 14 | ... |
| 22 | 364 | 8 | ... |
| 23 | 364 | 8 | ... |
| 24 | 370 | 10 | ... |
| 25 | 370 | 10 | ... |
| 26 | 372 | 12 | ... |
| 27 | 372 | 12 | ... |
| 28 | 374 | 10 | ... |
| 29 | 374 | 10 | ... |
| 30 | 376 | 10 | ... |
| 31 | 376 | 12 | ... |
| 32 | 376 | 10 | ... |

SIGNAL QUALITY EVALUATION DEVICE, SIGNAL QUALITY EVALUATION VALUE GENERATION METHOD, AND REPRODUCTION DEVICE

CROSS REFERENCE TO PRIOR APPLICATION

This application is a National Stage Patent Application of PCT International Patent Application No. PCT/JP2017/021684 (filed on Jun. 12, 2017) under 35 U.S.C. § 371, which claims priority to Japanese Patent Application No. 2016-168028 (filed on Aug. 30, 2016), which are all hereby incorporated by reference in their entirety.

TECHNICAL FIELD

The present disclosure relates to a signal quality evaluation device suitable in a case of performing decoding processing by partial response maximum likelihood (PRML) for a reproduction signal from a recording medium, or the like, for example, a signal quality evaluation value generation method, and a reproduction device including such a signal quality evaluation device and which reproduces information.

BACKGROUND ART

As optical disks as examples of recording media, a compact disc (CD), a digital versatile disc (DVD), and a Blu-ray disc (BD) (registered trademark) are widely used, for example. These disks show a history of high density recording.

Particularly, in the case of BD-level high density recording, a method using a technique called partial response maximum likelihood (PRML) detection is common as a bit detection method.

As is publicly known, PRML is a technology combining a process called partial response and a technology called maximum likelihood detection. The partial response refers to a process of returning an output longer than one bit to a one-bit input, in other words, a process of determining an output according to a plurality of input bits. In particular, a process of obtaining a reproduction signal as a signal obtained by multiplying successive four-bit information bit inputs by 1, 2, 2, and 1 in order and adding the products, which is often used in an optical disk such as a Blu-ray disc, is expressed as PR (1, 2, 2, 1).

Furthermore, the maximum likelihood detection is a method of defining a distance called path metric between two signal sequences, examining a distance between an actual signal and a signal expected from a presumed bit sequence, and detecting a bit sequence in which the distance becomes shortest. Note that, here, the path metric is a distance defined as a distance obtained by adding a square of an amplitude difference between two signals at the same time over all the times. Furthermore, Viterbi detection is used for searching for a bit sequence that minimizes this distance.

The partial response maximum likelihood detection combining the above process and method is a method of adjusting a signal obtained from bit information of a recording medium with a filter called equalizer to become a process of partial response, examining the path metric between an obtained reproduction signal and the partial response of the presumed bit sequence, and detecting a bit sequence in which the distance becomes shortest.

As a method of evaluating the quality of a reproduction signal of an optical disk, a method using a distribution of a metric difference (also called SAM value) that indicates a margin (path selection margin) of path selection of a Viterbi detector on the basis of the PRML detection principle has already been typical.

For example, Patent Documents 1, 2, 3, and 4 described below and the like disclose a signal quality evaluation method having a favorable correlation with an error rate of the PRML even at the time of high density recording of a conventional optical disk.

In any of the cases, in a PRML class to be actually used, several error patterns with statistically high error occurrence frequencies are extracted, index values are obtained for the respective error patterns, and the index values are integrated to construct an index value.

This is because the distribution of the metric difference (a distribution average value and variance) differs for each error pattern and thus cannot be handled as a single distribution.

CITATION LIST

Patent Document

Patent Document 1: Japanese Patent No. 3857685
Patent Document 2: Japanese Patent No. 3711140
Patent Document 3: Japanese Patent No. 4750488
Patent Document 4: International Publication No. 2010/001588

SUMMARY OF THE INVENTION

Problems to be Solved by the Invention

Meanwhile, further increasing linear density from a conventional optical disk and performing ultra-high density recording that exceeds 40 GB per recording layer equivalent to a BD has been examined, for example. In this case, noticeable deterioration of a frequency characteristic of a channel, in particular, of a high frequency component occurs, and inter-symbol interference of the reproduction signal is further intensified. Therefore, if a PRML class having a longer constraint length and conforming to the frequency characteristic of the channel is not newly introduced, sufficient reproduction performance cannot be secured. At this time, a dominant error pattern also changes from conventional conditions with the frequency characteristic of the reproduction channel and PRML class change.

Specifically, due to cutoff of a high frequency range of an optical amplitude transfer function (MTF), amplitude of a short mark reproduction signal is extremely lowered, and not only the shortest mark but also reproduction signal amplitude having a second shortest mark are rarely obtained.

For this reason, it cannot be said that the conventional signal quality evaluation method is in an appropriate situation.

Conventionally, the error patterns in the maximum likelihood decoding of PRML could be understood by units of bits or simply by one-bit shift of the shortest mark. In other words, it has been sufficient to consider only these error patterns to express the signal quality.

However, under the conditions of the ultra high density recording exceeding 40 GB equivalent to a BD, many block errors including a recording mark and space polarity reversal occur as the error patterns in the maximum likelihood decoding of PRML due to the above-described situation.

Then, contribution of these error patterns is dominant in the overall error rate. Since the block error patterns have error propagation properties, errors may occur over a very long section such as more than ten-clock section in some cases.

From this fact, even if an evaluation value is generated by detecting only the error patterns such as one-bit shift of the shortest mark, for example, it is hard to say that the evaluation value reflects the actual error rate.

Therefore, an object of the present disclosure is to provide a signal evaluation technique capable of having a high correlation to an error rate, that is, high accuracy even when high density recording further progresses.

Solutions to Problems

A signal quality evaluation device according to the present technology includes a first arithmetic unit configured to obtain an estimated value of a path selection error rate on the basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information, a second arithmetic unit configured to obtain an average error bit number in erroneous detection from a bit difference number between the maximum likelihood path and the second path at a time of path selection of each time in the maximum likelihood decoding, and an evaluation value generation unit configured to obtain an estimated bit error rate from arithmetic results by the first arithmetic unit and the second arithmetic unit, and generate an evaluation value according to the estimated bit error rate.

When an error in the path selection occurs is a case where the path metric difference becomes a negative value, but the case is unmeasurable. Therefore, the path selection error rate (path merge error rate) is estimated from the distribution of the path metric difference. That is, the path selection error rate indicates the frequency at which the path metric difference becomes a negative value. The path selection error rate is multiplied by an average bit error number obtained from a bit difference number at the time of path merging, whereby the bit error rate is estimated. The evaluation value is generated from the bit error rate.

In this case, the evaluation value is not calculated for some error patterns specified in advance, and the evaluation value covering all error patterns that are likely to occur is obtained.

In the signal quality evaluation device according to the present technology, it is conceivable that the first arithmetic unit obtains an estimated value of a path selection error rate from a normal distribution approximated to the distribution of a path metric difference.

The distribution of the path metric difference is superposition of a very large number of error patterns having different distances and is non-normal distribution. However, a portion close to zero can be relatively favorably approximated to the normal distribution. The path merge error rate (that is, the appearance frequency at which the path metric difference becomes less than 0) is estimated from this approximated normal distribution.

In the signal quality evaluation device according the present technology, it is conceivable that the second arithmetic unit obtains the average error bit number, using the bit difference number between the maximum likelihood path and the second path of a case where a value of the path metric difference between the maximum likelihood path and the second path is equal to or less than a predetermined threshold value.

The path metric difference (path selection margin: SAM value) and the bit difference number (path selection error bit number) are instantaneous values obtained for each sample. Generally, in a case where the path selection margin value (SAM value) is small, the path selection margin value can be regarded as a sample close to a detection error or a sample that has caused a detection error. As for the path selection error bit number, it is conceivable that a result closer to a behavior at the time of actual detection error can be obtained by obtaining an average value for samples close to a detection error. Therefore, an average path selection error number is obtained for samples equal to or less than a certain threshold value with respect to the SAM value.

In the signal quality evaluation device according to the present technology, it is conceivable that the evaluation value generation unit generates the evaluation value obtained by converting the estimated bit error rate obtained from the arithmetic results of the first arithmetic unit and the second arithmetic units into jitter.

By representing the evaluation value by jitter, compatibility with a conventional evaluation value can be secured.

A reproduction device according to the present technology includes a reproduction unit configured to reproduce a reproduction signal of bit information from a recording medium, a decoding unit configured to perform PRML decoding processing by partial response equalization and maximum likelihood decoding for the reproduction signal to decode binarized data, a first arithmetic unit configured to obtain an estimated value of a path selection error rate on the basis of a distribution of a path metric difference between a maximum likelihood path of each time, the maximum likelihood path being a detection path in the maximum likelihood decoding, and a second path having a second highest likelihood, a second arithmetic unit configured to obtain an average error bit number in erroneous detection from a bit difference number between the maximum likelihood path and the second path at a time of path selection of each time in the maximum likelihood decoding, and an evaluation value generation unit configured to obtain an estimated bit error rate from arithmetic results by the first arithmetic unit and the second arithmetic unit, and generate an evaluation value according to the estimated bit error rate.

That is, in the reproduction device having the reproduction unit and the decoding unit, a signal quality evaluation device including the first arithmetic unit, the second arithmetic unit, and the evaluation value generation unit is mounted.

In the reproduction device according to the present technology, it is conceivable that the decoding unit performs the maximum likelihood decoding by an adaptive Viterbi detector in which a reference level used for calculation of a branch metric is variably set according to a level of the reproduction signal.

That is, the signal quality evaluation device including the first arithmetic unit, the second arithmetic unit, and the evaluation value generation unit is used in a case where decoding by the adaptive Viterbi detector is performed.

A reproduction method according to the present technology includes a first arithmetic process of obtaining an estimated value of a path selection error rate on the basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information, a second arithmetic process of obtaining an average error bit number in erroneous detection from a bit difference number between the maximum likelihood path and the second path at a time of path selection of each time in the maximum likelihood decoding, and an evaluation value generation process of obtaining an estimated bit error rate from arithmetic results by the first arithmetic process and the second arithmetic process, and generating an evaluation value according to the estimated bit error rate.

By the method, the evaluation value covering all error patterns that are likely to occur is the calculated without specifying an error pattern.

Effects of the Invention

According to the present disclosure, there is an effect to obtain an evaluation value serving as an index of signal evaluation capable of having a high correlation to an error rate, that is, high accuracy for a reproduction signal of high density recording.

Note that the effects described here are not necessarily limited, and any of effects described in the present disclosure may be exhibited.

BRIEF DESCRIPTION OF DRAWINGS

FIG. 2 is explanatory diagrams of a maximum likelihood path and a second path for an RF signal.

FIG. 4 is explanatory diagrams of a correlation between an evaluation value and an error rate.

FIG. 5 is an explanatory diagram of error patterns of 11ISI.

MODE FOR CARRYING OUT THE INVENTION

Hereinafter, a reproduction device of an embodiment will be described in the following order. Note that a signal quality evaluation unit 10 mounted on a reproduction device 1 is an example of a signal quality evaluation device referred to in the claims.

<1. Configuration of Reproduction Device>
<2. Example of Evaluation Value Generation Using Metric Difference>
<3. Configuration and Operation of Signal Quality Evaluation Unit>
<4. Another Configuration Example of Signal Quality Evaluation Unit>
<5. Combination with Adaptive Viterbi>
<6. Conclusion and Modifications>

<1. Configuration of Reproduction Device>

Figure 1:
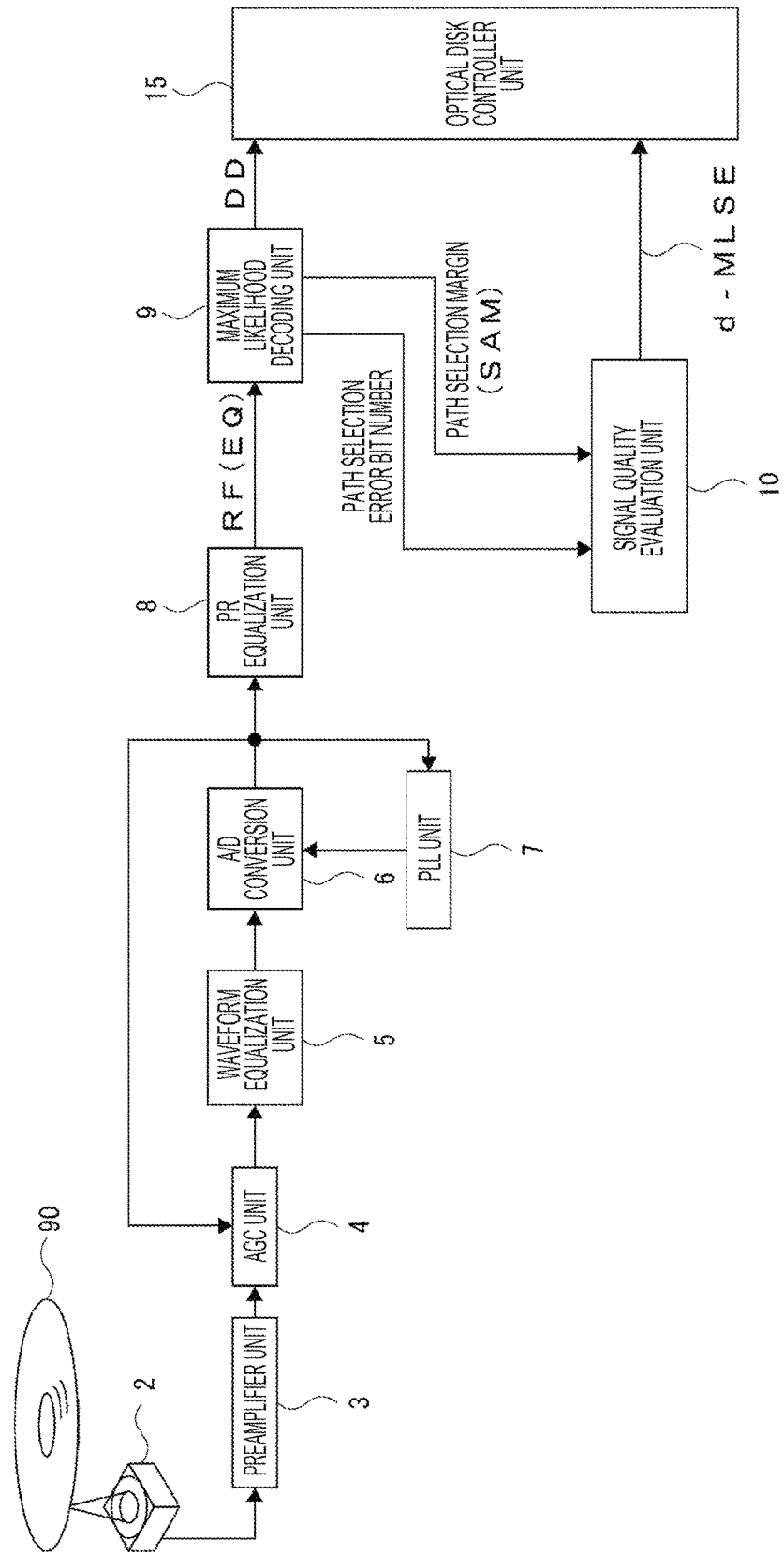
FIG. 1 is a block diagram of a reproduction device according to an embodiment of the present technology.

FIG. 1 illustrates a configuration example of the reproduction device 1 including the signal quality evaluation device (signal quality evaluation unit 10) according to an embodiment.

The reproduction device 1 in this case is configured to reproduce a signal from an optical disk 90 as an example of a recording medium and obtain an evaluation value d-MLSE serving as an index of quality evaluation of a reproduction signal.

The reproduction device 1 includes, for example, an optical pickup 2 that reproduces bit information from the optical disk 90 as a removable medium and a preamplifier unit 3 that converts a signal read by the optical pickup 2 into a reproduction signal (RF signal).

Furthermore, the reproduction device 1 includes an automatic gain control (AGC) unit 4 that processes the reproduction signal (RF signal), a waveform equalization unit 5, an A/D conversion unit 6, and a phase locked loop (PLL) unit 7.

Furthermore, the reproduction device 1 includes a partial response (PR) equalization unit 8 and a maximum likelihood decoding unit 9 to perform PRML decoding processing, and further includes the signal quality evaluation unit 10 and an optical disk controller unit 15.

The optical disk 90 to be reproduced is, for example, a high density disk that achieves a 33.4-GB capacity equivalent to a BD or a next generation high density disk that achieves an 80-GB capacity equivalent to a BD. Note that being equivalent to a BD referred to here means that the capacity of one recording layer is 80 GB under physical conditions of a Blu-ray disc.

In particular, in the present embodiment, an index for appropriate reproduction signal evaluation can be obtained even for a reproduction signal from a recording medium having very high recording density, in which the capacity of one recording layer is about 80 GB.

In the reproduction device 1, the optical pickup 2 converges laser light to a recording layer of the optical disk 90 via an objective lens, receives reflected light, and generates a reproduction signal (RF signal) as an analog signal indicating the bit information read from the optical disk 90.

The preamplifier unit 3 amplifies the reproduction signal with a predetermined gain and outputs the amplified reproduction signal to the AGC unit 4.

The AGC unit 4 adjusts, by amplifying or attenuating amplitude of the reproduction signal from the preamplifier unit 3 on the basis of an output from the A/D conversion unit 6, and outputs the reproduction signal with the adjusted amplitude to the waveform equalization unit 5.

The waveform equalization unit 5 has a low pass filter (LPF) characteristic to cut off a high frequency range of the reproduction signal and a high pass filter (HPF) characteristic to cut off a low frequency range of the reproduction signal, and shapes a waveform of the reproduction signal into a shape with necessary characteristics and outputs the reproduction signal to the A/D conversion unit 6.

The reproduction signal output from the waveform equalization unit 5 is sampled and converted into digital data by the A/D conversion unit 6.

The PLL unit 7 generates a reproduction clock to be synchronized with the reproduction signal after the waveform equalization by PLL processing on the basis of the output from the A/D conversion unit 6. The sampling in the A/D conversion unit 6 is performed at the timing of the reproduction clock generated by the PLL unit 7. Note that, although not illustrated, the reproduction clock is also used in the PR equalization unit 8 and the maximum likelihood decoding unit 9 for the PRML decoding, and is further used in the signal quality evaluation unit 10 and the optical disk controller unit 15.

The PRML decoding is performed for the reproduction signal converted into digital data by the PR equalization unit 8 and the maximum likelihood decoding unit 9, and binarized data DD as a decoding result is obtained.

The PR equalization unit 8 equalizes a channel response to a target response such as PR (1, 2, 2, 1) or PR (1, 2, 2, 2, 1), for example. In other words, high frequency noise suppression and intentional inter-symbol interference are added to the digital reproduction signal.

Furthermore, for example, in the case of considering the high density recording of 40 GB or more equivalent to a BD as the optical disk 90, the PR equalization unit 8 sets the target response of PR (1, 2, 3, 3, 3, 2, 1), for example.

Moreover, in the case of considering the high-density recording of 80 GB or more equivalent to a BD as the optical disk 90, the PR equalization unit 8 sets the target response of PR (3, 6, 9, 13, 16, 17, 16, 13, 9, 6, 3) of 11 inter-symbol interference (ISI) having a longer constraint length, for example.

The reproduction signal RF (EQ) to which the equalization processing has been applied by the PR equalization unit 8 is supplied to the maximum likelihood decoding unit 9.

The maximum likelihood decoding unit 9 is configured as, for example, a Viterbi detector.

For Viterbi detection, a Viterbi detector configured by a plurality of states configured by successive bits of a predetermined length as a unit and branches represented by transitions between the states is used, and the Viterbi detector is configured to efficiently detect a desired bit sequence from among all possible bit sequences.

In an actual circuit, two registers are prepared for each state, including a register called path metric register that stores a path metric between a partial response sequence up to the state and a signal, and a register called path memory register that stores a bit sequence flow (path memory) up to the state. Furthermore, an arithmetic unit called branch metric unit is prepared for each branch, which calculates a path metric between a partial response sequence and a signal in the bit of the branch.

With the Viterbi detector, each of various bit sequences can be associated with one of paths passing through the above-described states on a one-to-one basis. Furthermore, the path metric between the partial response sequence passing through these paths and an actual signal (reproduction signal) is obtained by sequentially adding transitions between the states configuring the above-described paths, in other words, the above-described branch metrics in the branches.

Moreover, selection of a path that minimizes the above-described path metric is realized by sequentially selecting a path with a smaller path metric while comparing the magnitude between the path metrics of two or less branches that reach each state. By transferring selection information to the path memory register, information expressing the path reaching each state in a bit sequence is stored. Since the value of the path memory register is eventually converged to a bit sequence that minimizes the path metric while being sequentially updated, a result of the convergence is output.

The binarized data DD obtained as a decoding result by the maximum likelihood decoding unit 9 is output to the optical disk controller unit 15.

The optical disk controller unit 15 performs decoding processing, error correction processing, and the like for the binarized data DD to demodulate reproduction data from the optical disk 90.

Although details will be described below, the signal quality evaluation unit 10 sequentially inputs a path selection margin (SAM) and a path selection error bit number at each point of time from the maximum likelihood decoding unit 9, generates the evaluation value d-MLSE for reproduction signal quality evaluation, and outputs the evaluation value d-MLSE to the optical disk controller unit 15. The optical disk controller unit 15 can evaluate the reproduction signal quality with the evaluation value d-MLSE.

<2. Evaluation Value Generation Using Metric Difference>

Prior to description of the configuration of the signal quality evaluation unit 10 of the present embodiment, an outline of a conventional method of generating an index value using a metric difference and technical circumstances of coping with the high density recording will be described.

As already publicly known, in the bit detection method by PRML, a magnitude relationship between a Euclidean distance (in other words, a path metric for a correct bit sequence) between a partial response sequence obtained from a correct bit sequence and the reproduction signal, and a Euclidean distance (in other words, a path metric for an erroneous bit sequence) between a partial response sequence obtained from an erroneous bit sequence and the reproduction signal is compared. Then, the bit detection method by PRML is an algorithm to leave a shorter distance, that is, a smaller path metric value, as a more likely path, and obtain a path (maximum likelihood path) that finally survives by repeating the above operation, as a detection result.

According to such an algorithm, regarding top two paths having small path metric values (a maximum likelihood path Pa and a second path Pb), which are finally surviving path selection candidates, a surviving path is a more likely path when a difference between the path metrics of the two paths is large, and the two paths are confusing, in other words, a possibility of erroneous detection is large, when the difference is small. This point will be described with reference to FIG. 2.

FIGS. 2A and 2B are diagrams illustrating relationships between the maximum likelihood path Pa and the second path Pb, and an actual reproduction signal (reproduction signal RF (EQ) PR-equalized by the PR equalization unit 8).

Note that, here, a case of PR (1, 2, 2, 1) is illustrated for simplicity of illustration and description.

In FIGS. 2A and 2B, values of "+3, +2, +1, 0, −1, −2, and −3" on the vertical axes indicate values of reference levels assumed in PR (1, 2, 2, 1).

Here, the illustrated maximum likelihood path Pa and second path Pb can be regarded as two paths that are finally compared with the reproduction signal RF (EQ). In other words, the value of the path metric for the maximum likelihood path Pa is compared with the value of the path metric for the second path Pb, and the path with the smaller value is selected as the surviving path.

Note that the path metric is, in FIG. 2, a sum of Euclidean distances between sampling values of the reproduction signal RF (EQ) obtained at sampling timings illustrated by the black circles and respective values obtained at corresponding sampling timings in the maximum likelihood path Pa (or the second path Pb), in other words, a sum of the branch metrics.

Then, comparing FIG. 2A with FIG. 2B, the Euclidean distance between the maximum likelihood path Pa and the reproduction signal RF (EQ) is sufficiently short in the case of FIG. 2A, and in contrast, the Euclidean distance between the second path Pb and the reproduction signal RF (EQ) is sufficiently long. That is, the value of the path metric for the maximum likelihood path Pa is sufficiently small and the value of the path metric for the second path Pb is sufficiently large. Therefore, the maximum likelihood path Pa serving as a detection path in this case can be determined to be the more likely path.

In contrast, in FIG. 2B, the Euclidean distance between the maximum likelihood path Pa and the reproduction signal RF (EQ) expands as compared with the case of FIG. 2A, and the Euclidean distance between the second path Pb and the reproduction signal RF (EQ) becomes short. That is, in this case, the value of the path metric for the maximum likelihood path Pa becomes larger than that in the case of FIG. 2A, and in contrast, the value of the path metric for the second path Pb becomes smaller. Therefore, the likelihood of the maximum likelihood path Pa as the detection path in this case decreases. In other words, in this case, the likelihood of the other second path Pb increases, which increases a possibility that the second path Pb is the most likely path. Therefore, there is a high possibility that the detection path as the maximum likelihood path Pa is an erroneously detected path for the path shown as the second path Pb.

In this way, in the case where the value of the path metric for the maximum likelihood path Pa is sufficiently smaller than the value of the path metric for the second path Pb (in the case where the difference between the path metrics is large), more likely bit detection being executed can be detected.

Furthermore, to the contrary, the possibility that the detection path as the maximum likelihood path Pa is wrong can be determined to be higher as the value of the path metric for the maximum likelihood path Pa becomes larger and the value of the path metric for the second path Pb becomes smaller (the difference between the path metrics becomes smaller).

Detection accuracy (reproduction signal quality) in the case of adopting the PRML technique can be estimated as described above by obtaining the difference between the value of the path metric for the maximum likelihood path Pa and the value of the path metric for the second path Pb, that is, by obtaining the metric difference.

Here, such a metric difference (SAM) is defined as follows.

$$SAM = \sum_i (PB_i - R_i)^2 - \sum_i (PA_i - R_i)^2 \qquad \text{[Expression 1]}$$

Note that "$PB_i$", "$PA_i$" and "$R_i$" represent the values of the second path Pb, the maximum likelihood path Pa, and the reproduction signal RF (EQ) at the same sampling timing, respectively.

In other words, the metric difference (SAM) in this case is defined as a value obtained by subtracting the value of the path metric for the maximum likelihood path Pa from the value of the path metric for the second path Pb.

A maximum value of such a metric difference (SAM) is obtained when the value of the path metric for the maximum likelihood path Pa on the right side of the above expression becomes "0", in other words, when the maximum likelihood path Pa perfectly matches the reproduction signal RF (EQ). In other words, the metric difference (SAM) is information indicating that the detection accuracy is higher (that is, the signal quality is more favorable) as the value is larger.

Furthermore, the SAM value also becomes the value of the path selection margin.

Furthermore, from FIG. 2 above, the maximum likelihood path Pa completely matching the reproduction signal RF (EQ) means that the path metric for the second path Pb in this case becomes the Euclidean distance between the maximum likelihood path Pa and the second path Pb. Therefore, the maximum value of the metric difference (SAM) as described above becomes the Euclidean distance value between the maximum likelihood path Pa and the second path Pb.

Furthermore, the minimum value is "0" in a case where the value of the path metric for the maximum likelihood path Pa and the value of the path metric for the second path Pb become the same value, in other words, in a case where the reproduction signal RF (EQ) is obtained at a position exactly in the middle between the maximum likelihood path Pa and the second path Pb in the case of FIG. 2. That is, the value "0" of the metric difference (SAM) indicates that both the maximum likelihood path and the second path are equally likely, and thus indicates that the possibility of an error is the highest.

From the above facts, it is found that the metric difference (SAM) is information indicating that the detection accuracy is higher as the metric difference is close to the value (maximum value) of the Euclidean distance between the maximum likelihood path Pa and the second path Pb, and in contrast, the detection accuracy is lower and the possibility of an error is higher as the metric difference is closer to "0" (minimum value).

According to the difference value between the value of the path metric for the maximum likelihood path Pa and the value of the path metric for the second path Pb, like the metric difference (SAM) by the above [Expression 1], an error occurrence rate in the PRML decoding processing can be estimated.

For example, an error rate can be estimated by obtaining statistical information such as a variance value for the value of the metric difference as the difference between the value of the path metric for the maximum likelihood path Pa and the value of the path metric for the second path Pb, for example.

By the way, in the case of adopting the PRML technique, there are circumstances that difference patterns (error patterns) between the maximum likelihood path and the second path, which may actually be detection errors, are limited to a certain extent in the case of a relatively short ISI.

Examples include a one-bit error in which an edge of a pattern of a bit sequence of the second path is shifted by one bit sequence with respect to a pattern of a bit sequence of the maximum likelihood path, for example, a two-bit error by disappearance of a 2T mark that is a shortest mark, for example, and the like.

In the early stage where the PRML decoding has been adopted for reproduction of an optical disk, the error pattern that actually appears as an error has been almost entirely limited to the one-bit error. Therefore, the signal quality has been able to be properly evaluated by obtaining a distribution of the metric difference only for the one-bit error that is the only error pattern.

However, thereafter, as the high recording density of optical disks progresses, the error patterns that may appear as actual errors are not single, and a plurality of patterns becomes contributing to errors.

Therefore, in a PRML class to be actually used, a technique of extracting some error patterns having statistically high error occurrence frequencies, obtaining an evaluation value for each of the error patterns, and integrating the evaluation values to configure an evaluation value has been examined.

This is because the distribution of the metric difference (a distribution average value and variance) differs for each error pattern and thus cannot be handled as a single distribution.

Figure 3:
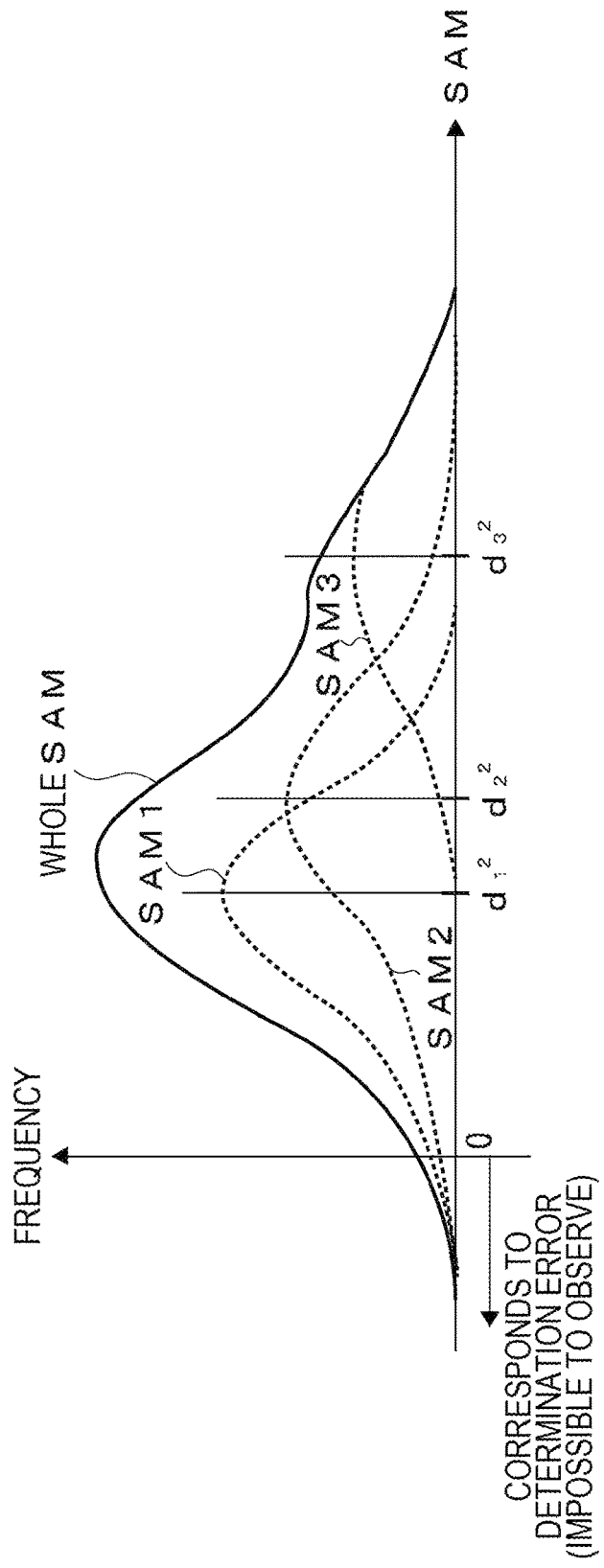
FIG. 3 is an explanatory diagram in which distributions of metric differences are superimposed.

FIG. 3 illustrates distribution examples of the metric differences (SAMs) for error patterns having different Euclidean distances from one another. Note that in FIG. 3, the vertical axis represents the frequency of sampling and the horizontal axis represents the value of the metric difference (SAM).

In FIG. 3, for example, three error patterns PTk (k is 1 to 3) mainly contribute to actual error occurrence, and examples of distributions of the metric differences (SAMs) are illustrated.

For example, the distribution illustrated as SAM1 in FIG. 3 is assumed to be a distribution of the metric difference (SAM) for an error pattern PT1 corresponding to a so-called one-bit error in which a different bit number between the bit sequence of the maximum likelihood path Pa and the bit sequence of the second path Pb is one bit. Furthermore, the distribution illustrated as SAM2 can be exemplified as a distribution of the metric difference (SAM) for an error pattern PT2 corresponding to a two-bit error such as the shortest mark shift or the like, and further, the distribution illustrated as SAM3 can be exemplified as a distribution of the metric difference (SAM) for an error pattern PT3 corresponding to a three-bit error, for example.

Note that the distribution illustrated as "whole SAM" in FIG. 3 illustrates superposition of the three distributions SAM1 to SAM3.

At this time, as described above, the different bit numbers are different between the maximum likelihood path Pa and the second path Pb, so that in the error patterns PT1 to PT3, the Euclidean distances between the maximum likelihood path Pa and the second path Pb are different.

Here, the Euclidean distance between the maximum likelihood path Pa and the second path Pb can be calculated by obtaining a square of the difference between the values traced by the respective paths and then calculating the sum of the squares. Therefore, at this time, the Euclidean distance "$d_k^2$" in each error pattern PTk can be expressed by $$d_k^2 = \sum_i (PA_i - PB_i)^2 \qquad \text{[Expression 2]}$$

where the values at the same sampling timing of the maximum likelihood path Pa and the second path Pb are $PA_i$ and $PB_i$, respectively.

Furthermore, under the assumption that the distribution of the metric difference (SAM) is a Gaussian distribution, an average value of each distribution is the value of the Euclidean distance $d_k^2$ between the maximum likelihood path Pa and the second path Pb in the error pattern PTk. That is, assuming that the distribution of the metric difference (SAM) is a Gaussian distribution as described above, the average value of the distribution should be the value of the metric difference (SAM) when the signal quality is the most favorable.

Then, the value of the metric difference (SAM) when the best signal quality is obtained in this way is the value of the Euclidean distance between the maximum likelihood path Pa and the second path Pb according to the formula for calculating the metric difference (SAM) according to the above [Expression 1].

Here, the Euclidean distance between the maximum likelihood path Pa and the second path Pb in the error pattern PT1 is defined as a Euclidean distance $d_1^2$, and the Euclidean distances between the maximum likelihood path Pa and the second path Pb in the error patterns PT2 and PT3 are a Euclidean distance $d_2^2$ and a Euclidean distance $d_3^2$, respectively.

A portion where the value of the metric difference (SAM) illustrated on the horizontal axis in FIG. 3 becomes "0" is, as can be understood from the description about the metric difference (SAM), a portion where the value of the path metric for the maximum likelihood path Pa and the value of the path metric for the second path Pb become the same value, and thus a portion where the possibility of detection error is the highest.

Then, a portion that exceeds (falls below) the portion where the value of the metric difference (SAM) becomes "0" indicates a portion where a detection error actually occurs, and this portion is a portion impossible to observe in PRML. That is, the value of the metric difference (SAM) becoming a negative value, exceeding "0", as described above, means that the value of the path metric for the second path Pb becomes smaller than the value of the path metric for the maximum likelihood path Pa. However, in the detection technique in PRML, a path with the smallest value of the path metric is detected as the maximum likelihood path. Therefore, it is not possible that the value of the metric difference (SAM) becomes a negative value. Therefore, it is impossible to actually observe the portion where a detection error occurs.

In this way, since it is impossible to actually observe the portion where a detection error occurs in the PRML, obtaining an evaluation value on the basis of the following idea has been examined as an example.

FIG. 4A illustrates a distribution (SAMk) of the metric difference (SAM) with a certain error pattern PTk.

Note that the vertical axis represents the sampling frequency and the horizontal axis represents the value of the metric difference (SAM) in FIG. 4A, similarly to FIG. 3.

The error rate is assumed to be estimated by setting a predetermined threshold value (Th_k) for the value of the metric difference (SAM), as illustrated in FIG. 4A, and obtaining an appearance frequency (Fk) of the value of the metric difference (SAM) that falls below the predetermined threshold value Th_k.

Such an appearance frequency Fk of the value of the metric difference (SAM) that falls below the predetermined threshold value Th_k is in a correlation with the portion (bit error rate bER) where the metric difference (SAM)<0.

In other words, for example, assuming that the signal quality deteriorates and the bit error rate bER rises, the distribution SAMk at that time becomes a distribution in which the base relatively expands as illustrated in FIG. 4A, for example. However, in this case, the appearance frequency Fk (the area of the portion Fk in FIG. 4A) also tends to increase. That is, the appearance frequency Fk also rises with the rise of the bit error rate bER.

Furthermore, on the other hand, in a case where the signal quality is more favorable than that in the case of FIG. 4A and the bit error rate bER decreases, the distribution SAMk has a sharper shape, as illustrated in FIG. 4B, for example. In this case, the appearance frequency Fk also decreases, and therefore it is found that the value of the appearance frequency Fk decreases in response to the decrease in the bit error rate bER.

As described above, an index correlating with the bit error rate bER is obtained by the appearance frequency Fk of the value of the metric difference (SAM) that falls below the threshold value Th_k.

For example, when the threshold value Th_k is appropriately respectively set for the distributions (SAM 1, SAM2, and SAM3) of the metric differences (SAM) of the error patterns PT1, PT2, and PT3 for which the evaluation values are calculated, and the appearance frequencies Fk of the values of the metric differences (SAM) falling below the threshold values Th_k are detected and put together, evaluation values highly correlating with nearly an actual bit error rate can be obtained.

Note that the above is an example of a way of thinking of detecting a specific error pattern, obtaining a distribution of a metric difference of the error pattern, and calculating the evaluation value.

In other words, error patterns that are likely to occur are limited to several types, and estimated error rates obtained for respective patters are added, whereby a total error rate is estimated and the signal quality is quantified.

However, due to further progress of the high density recording, circumstances that cannot be handled by this technique have arisen. To handle the high density recording, a long ISI has also been in progress.

In Viterbi detection with a long ISI such as 9ISI or more, for example, there are numerous competing patterns of a detection distance, and as a result, a very large number of error patterns actually appear.

Since the evaluation can be performed only with some samples by the method of performing an operation for each error pattern, there is a concern of deterioration in accuracy.

Figure 6:
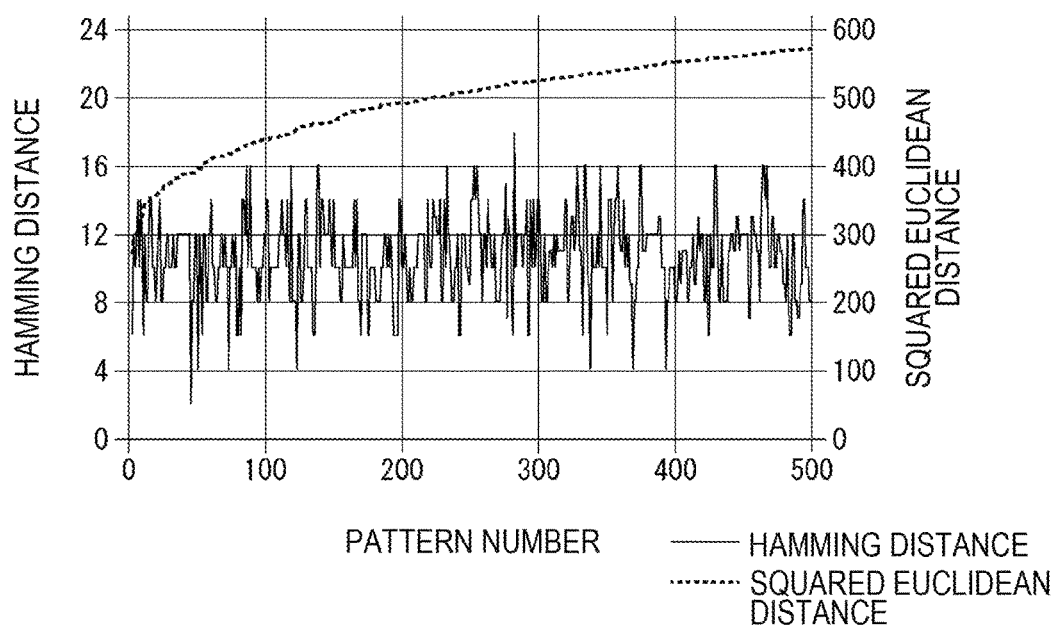
FIG. 6 is an explanatory diagram of a Hamming distance and a squared Euclidean distance of an error pattern of 11ISI.

For example, FIGS. 5 and 6 illustrate error patterns of PR (3, 6, 9, 13, 16, 17, 16, 13, 9, 6, 3) as 11ISI that is examined to adopt in the next generation high density disk system.

FIG. 5 illustrates error patterns with pattern numbers 1 to 32 assigned in ascending order of the squared Euclidean distance, as various error patterns of 24-bit section. For each error pattern, a squared Euclidean distance, a Hamming distance (error bit number), and the error pattern are illustrated. Although only the pattern numbers up to 32 are illustrated here, there are also patterns after a pattern number 33.

FIG. 6 illustrates the Hamming distance and the squared Euclidean distance of each error pattern in a range of the pattern numbers up to 500.

As can be seen from FIGS. 5 and 6, the Viterbi detector having a long constraint length such as 11ISI has a large number (several tens to several hundreds) of patterns competing with one another in the Viterbi detection (having the squared Euclidean distances close to one another) while having different Hamming distances (bit difference=error pattern).

Furthermore, the patterns are distributed in a long tail manner, for which a clear threshold value cannot be set in terms of frequency.

Then, when adopting a method targeting several dominant error patterns, addition of new error patterns cannot be kept up or the dominant error patterns cannot be specified, and in practice, this method cannot be handled. This situation is believed to continue as the constraint length becomes longer in the future.

Therefore, in the present embodiment, the way of thinking of specifying error patterns and performing processing is stopped, and a technique coping with every error pattern and obtaining a high correlation with an actual error rate is proposed.

The signal quality evaluation unit 10 of the present embodiment to be described below can calculate the evaluation value d-MLSE serving as an index of reproduction signal quality without specifying the error pattern.

<3. Configuration and Operation of Signal Quality Evaluation Unit>

Figure 7:
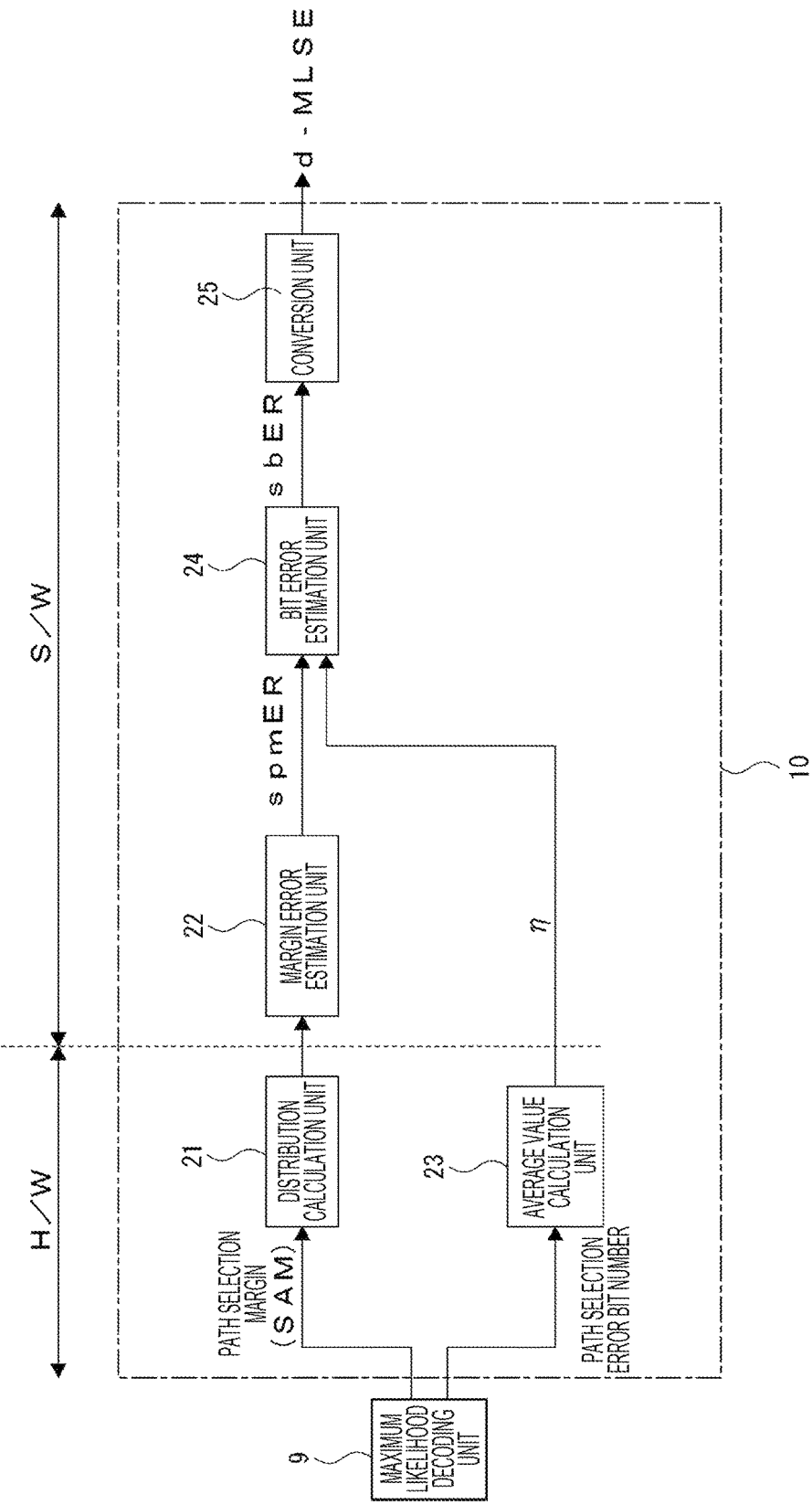
FIG. 7 is a block diagram of a signal quality evaluation unit according to an embodiment.

FIG. 7 illustrates a configuration of the signal quality evaluation unit 10. The signal quality evaluation unit 10 includes a distribution calculation unit 21, a merge error estimation unit 22, an average value calculation unit 23, a bit error estimation unit 24, and a conversion unit 25.

The path selection margin (metric difference (SAM)) and the path selection error bit number are supplied from an internal calculation result of the maximum likelihood decoding unit 9 (Viterbi detector) to the signal quality evaluation unit 10.

The path selection margin (metric difference (SAM)) as an instantaneous value is sequentially supplied from the maximum likelihood decoding unit 9 to the distribution calculation unit 21. The distribution calculation unit 21 obtains a distribution (histogram) of SAM values.

Here, simplification of the metric difference (SAM) is described.

The SAM value is originally the metric difference between the maximum likelihood path Pa and the second path Pb as described in [Expression 1], and many resources are required to obtain the SAM value. Therefore, the SAM value simplified by temporary determination is obtained.

Figure 8:
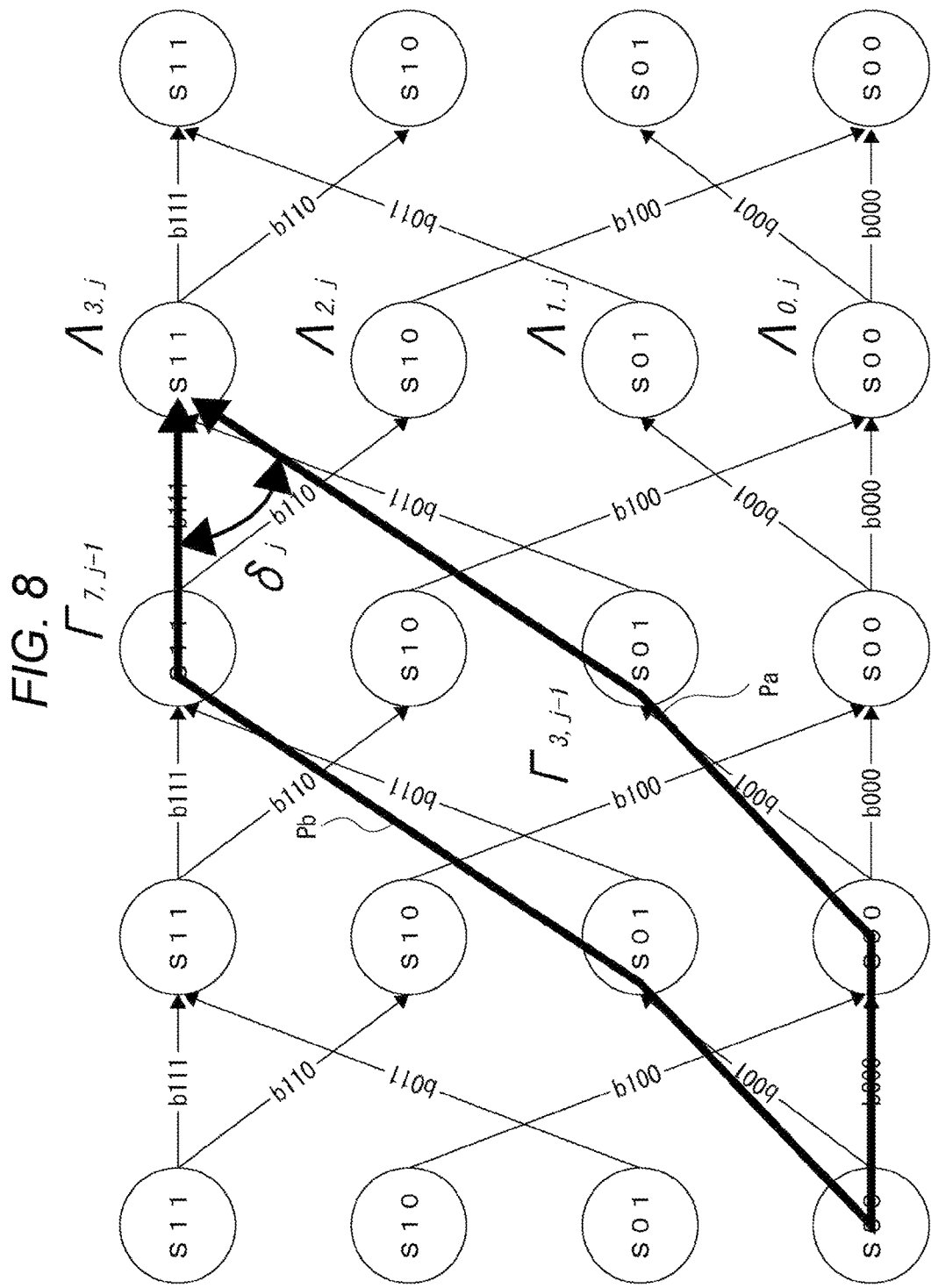
FIG. 8 is an explanatory diagram of simplification of a metric difference according to an embodiment.

FIG. 8 illustrates an example of the maximum likelihood path Pa and the second path Pb that transition in states S00, S01, S10, and S11.

$\Gamma_{i,j}$ is the path metric at a branch i at time j.

$\Lambda_{i,j}$ is the state metric at a state i at the time j.

The definition of simple SAM ($\delta_j$) at the time j is illustrated in [Expression 3].

$B_i$ is a set of branches transitioning to the state i.

$$\delta_j = \min_{\substack{i \neq k \\ i,k \in B_{i_m}}} \{|\Gamma_{i,j} - \Gamma_{k,j}|\} \quad \text{[Expression 3]}$$

$$i_m = \operatorname{argmin}_i \Lambda_{i,j}:$$

Minimum state (temporary determination)

Note that use of such a simple SAM is merely an example. Use of the original SAM value is naturally possible and there are various other simple methods of calculating the SAM value.

The distribution calculation unit 21 in FIG. 7 counts the frequency of each value with respect to the input SAM value (which may be a simple SAM value) and obtains a distribution.

Figure 9:
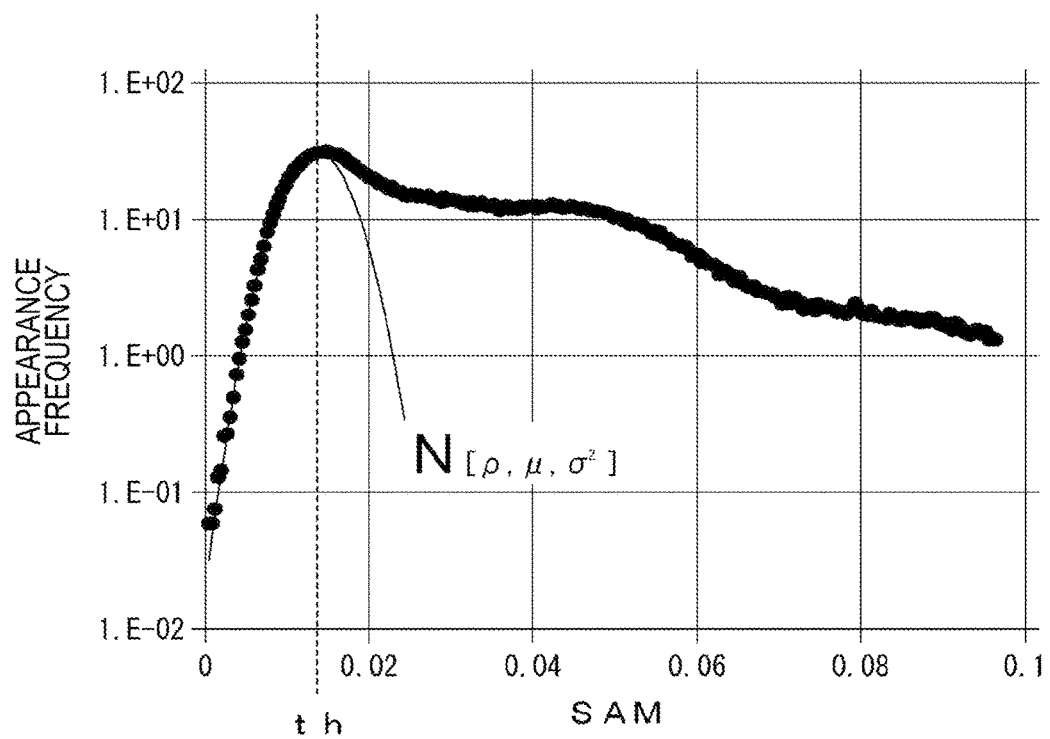
FIG. 9 is an explanatory diagram of a SAM distribution according to an embodiment.

FIG. 9 illustrates an example of the SAM distribution. The horizontal axis represents the SAM value and the vertical axis represents the appearance frequency. Note that the vertical axis is illustrated on a logarithmic scale. • is the frequency of each SAM value.

As described above, the possibility of an error becomes higher as the SAM value is closer to zero.

The path selection error bit number as an instantaneous value is sequentially supplied from the maximum likelihood decoding unit 9 to the average value calculation unit 23 in the signal quality evaluation unit 10 in FIG. 7. The average value calculation unit 23 calculates an average value (average error bit number η) of the path selection error bit numbers.

The path selection error bit number is the number of bits that becomes an error when there is a path selection error, that is, the path selection error bit number can be said to be the number of different bits between the bit sequences of the maximum likelihood path Pa and the second path Pb stored in the path memory.

An average path memory bit different number is assumed to be the average error bit number η.

The average error bit number η per path merge is expressed as below from a bit different number ηj at the time j.

$$\eta_j = N_1(\gamma_{i,j} \wedge \gamma_{k,j})$$ [Expression 4]

$$\eta = \langle \eta_j \rangle = \sum_j^N \frac{\eta_j}{N}$$

γi, j is a path memory bit string (path selection information) at the branch i at the time j.

$N_1(\ )$ is a function to obtain the number of bits 1 in binary representation.

The merge error estimation unit 22 in the signal quality evaluation unit 10 in FIG. 7 performs an operation to obtain an estimated value of a path selection error rate on the basis of the SAM distribution calculated by the distribution calculation unit 21. In other words, the merge error estimation unit 22 performs an operation to perform estimation by an error function, regarding a region in which the SAM value is close to zero in the SAM distribution as a normal distribution.

For example, the SAM distribution as illustrated in FIG. 9 is obtained by the distribution calculation unit 21. The SAM distribution is superposition of a very large number of error patterns having different distances (averages and variances) and is a non-normal distribution.

Meanwhile, what is to be obtained for signal evaluation is a sum total of negative probabilities of the SAM values. However, as described above, the negative region of the SAM values is not measurable.

Here, a critical portion (the SAM value is close to zero) can be relatively favorably approximated to the normal distribution. Therefore, a small region with a small SAM value is cut out and fit in the normal distribution. This is the normal distribution curve (N[ρ, μ, σ²]) illustrated by the solid line in FIG. 9.

A path merge error rate (the appearance frequency of SAM <0) is estimated from the approximated normal distribution. This error rate is estimated to be equal to the actual error rate.

Specifically, an estimated path merge error rate spmER is calculated by an operation by the following [Expression 5].

$$spmER = \frac{\rho}{2} * \mathrm{erfc}\left(\frac{\mu}{\sqrt{2\sigma^2}}\right)$$ [Expression 5]

ρ is a ratio of the area defined by the normal distribution curve in a case of normalizing the whole area of the SAM distribution (an integral value of values of •) to "1".

μ is an average value of the normal distribution, and σ is a standard deviation.

erfc( ) is a complementary error function.

The bit error estimation unit 24 in FIG. 7 obtains an estimated bit error rate sbER as a signal quality evaluation value from the arithmetic result of the merge error estimation unit 22 and the arithmetic result of the average value calculation unit 23. In the present embodiment, the evaluation value d-MLSE obtained by converting the estimated bit error rate sbER into jitter is further output as the signal quality evaluation value.

For the operation, the bit error estimation unit 24 and the conversion unit 25 function as an evaluation value generation unit.

The above-described estimated path merge error rate spmER is supplied from the merge error estimation unit 22 to the bit error estimation unit 24 and the average error bit number η is supplied from the average value calculation unit 23 to the bit error estimation unit 24. The bit error estimation unit 24 estimates the bit error rate by multiplying the estimated path merge error rate spmER by the average error bit number η. In other words, the estimated bit error rate sbER is obtained as:

sbER=η*spmER [Expression 6]

The estimated bit error rate sbER obtained as described above is supplied to the conversion unit 25.

The conversion unit 25 obtains the evaluation value d-MLSE converted into jitter from the estimated bit error rate sbER as a final signal evaluation value, as follows.

$$d\text{-}MLSE \equiv \frac{1}{2\sqrt{2}\,\mathrm{erfc}^{-1}(2sbER)}$$ [Expression 7]

The evaluation value d-MLSE obtained by the operation is supplied to the optical disk controller unit 15 in FIG. 1.

Figure 10:
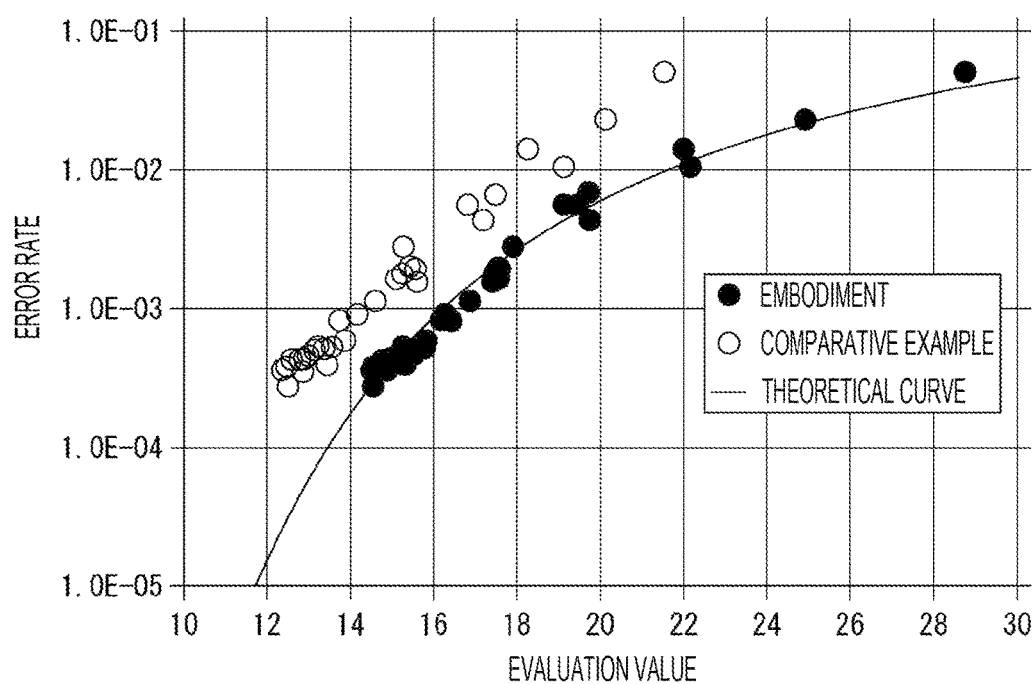
FIG. 10 is an explanatory diagram of experimental results of an embodiment and a comparative example.

FIG. 10 illustrates an example of experiment results. The experimental results are experimental results in the next generation disk of an 80-GB capacity equivalent to a BD. The vertical axis represents the error rate and the horizontal axis represents the evaluation value, and the theoretical curve indicates a relationship between the theoretical error rate and the evaluation value.

Here, • represents the value of the evaluation value d-MLSE and the error rate obtained by the method of the embodiment. ○ represents the evaluation value and the error rate in a case of the method of obtaining the evaluation value, using some specified error patterns (six types), as described above, as a comparative example.

In the case of the comparative example, the estimated error rate is underestimated. That is, a measured error rate becomes higher than the evaluation value. Furthermore, the correlation deteriorates because the whole is estimated from some behavior. In other words, the variation becomes large.

Meanwhile, in the case of the evaluation value d-MLSE of the method of the present embodiment, all of error patterns are covered even if the detector becomes complicated (the constraint length increases and the internal state increases). Therefore, the estimated value and measured value perfectly match, and a result of an improved correlation is obtained.

As described above, the signal quality evaluation unit 10 of the embodiment can obtain the evaluation value d-MLSE with high accuracy by a relatively simple operation.

By the way, FIG. 7 illustrates a portion performed by hardware (H/W) and a portion performed by software (S/W) in the configuration of the signal quality evaluation unit 10.

In this case, an example in which the distribution calculation unit 21 and the average value calculation unit 23 are configured by hardware and the merge error estimation unit 22, the bit error estimation unit 24, and the conversion unit 25 are realized by software (firmware) is illustrated.

An operation of the path selection margin (SAM) and measurement of the distribution (histogram), and an operation of the path selection error bit number and an operation of the average value inside the maximum likelihood decoding unit 9 (Viterbi detector) require rates equivalent to a channel clock, respectively. Therefore, implementation by hardware is desirable to realize real-time processing.

Meanwhile, although throughput for operation after the error number estimation (the merge error and the bit error) can be low because of using a result after statistical processing, use of a complex function such as logarithm and error function and sophisticated arithmetic processing such as fitting to a quadratic function are required. Therefore, implementation by software is suitable for the above operation.

Of course this is an example. The entire signal quality evaluation unit 10 can be implemented by hardware or by software.

<4. Another Configuration Example of Signal Quality Evaluation Unit>

Figure 11:
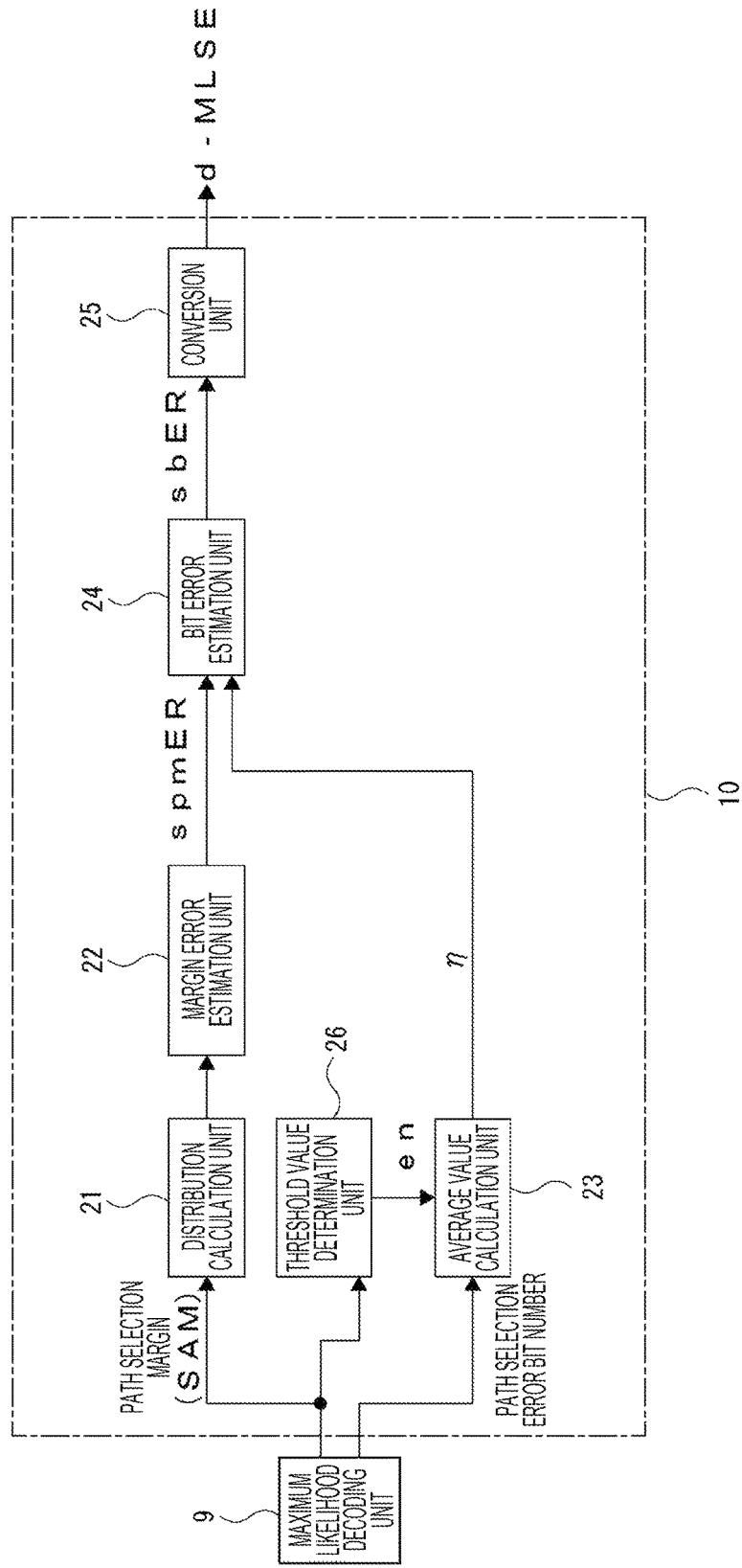
FIG. 11 is a block diagram of a signal quality evaluation unit according to another embodiment.

FIG. 11 illustrates another configuration example of the signal quality evaluation unit 10. Note that the same parts as those in FIG. 7 are denoted by the same reference numerals, and description thereof is omitted.

In this example, a threshold value determination unit 26 is included in addition to the configuration in FIG. 7. The threshold value determination unit 26 inputs the path selection margin (SAM) and confirms whether or not the SAM value is equal or less than a predetermined threshold value th. Then, in a case where the SAM value is not equal to or less than the threshold value th, the threshold value determination unit 26 outputs an enable signal en to the average value calculation unit 23.

The average value calculation unit 23 excludes the path selection error bit number at the timing when the enable signal en is supplied from samples for obtaining the average value.

FIG. 9 illustrates an example of the threshold value th. The threshold value th may be a fixed value or a variable value.

For example, when the detection margin can be considered to be small with a value or less, the value may be set as the threshold value th. Furthermore, a deterministic value such as a minimum Euclidean distance obtained from an equalization PR class may be used. Furthermore, an adaptive value obtained while seeing the distribution of the path selection margin may be used. For example, a mode of the distribution, or the like may be used.

The path selection margin (SAM) and the path selection error bit number are instantaneous values obtained for each sample.

Generally, in a case where the path selection margin (SAM) is small, the path selection margin can be regarded as a sample close to a detection error or a sample that has caused a detection error.

As for the path selection error bit number, it is conceivable that a result closer to a behavior at the time of actual detection error can be obtained by obtaining an average value for samples close to a detection error.

Therefore, the threshold value th is set, and an average path selection error number is obtained for samples equal to or less than the threshold value th with respect to the SAM value.

The reliability of the measurement result can be enhanced by selecting the samples in this manner. As a result, improvement of the accuracy of the final evaluation value d-MLSE can also be expected.

<5. Combination with Adaptive Viterbi>

Figure 12:
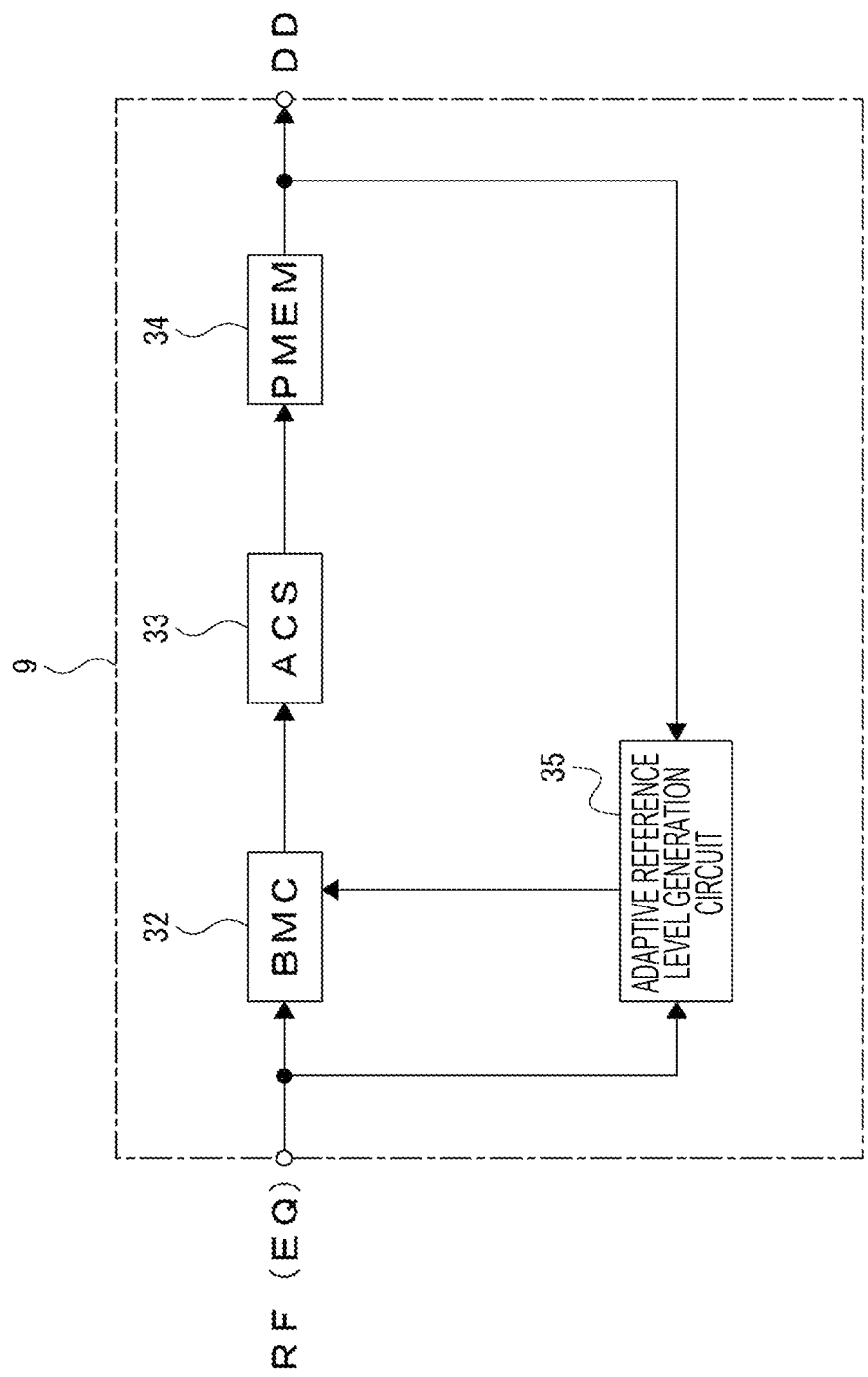
FIG. 12 is a block diagram of an adaptive Viterbi detector according to an embodiment.

FIG. 12 illustrates a configuration of the maximum likelihood decoding unit 9 in a case of using an adaptive Viterbi detector. The signal quality evaluation unit 10 of the present embodiment is suitable even in the case where the maximum likelihood decoding unit 9 is the adaptive Viterbi detector. An adaptive Viterbi detector is disclosed in Japanese Patent No. 4622632, for example.

The maximum likelihood decoding unit 9 in FIG. 12 includes a branch metric calculation unit (BMC) 32 that calculates a branch metric for each branch from the reproduction signal RF (EQ) from the PR equalization unit 8, a path metric updating unit (ACS) 33 that takes in the branch metrics, compares the branches, selects a path, and updates the path metric, and a path memory update unit (PMEM) 34 that updates the path memory according to the selected path information.

Then, an adaptive reference level generation circuit 35 for generating a reference level according to the level of the reproduction signal RF (EQ) is provided to realize an adaptive Viterbi detection operation.

In this case, the branch metric calculation unit 32 calculates the branch metric corresponding to each branch on the basis of the value of the reproduction signal RF (EQ) from the PR equalization unit 8 and a value (reference level data) of each reference level set by the adaptive reference level generation circuit 35.

The adaptive reference level generation circuit 35 generates the reference level data to be set to the branch metric calculation unit 32 on the basis of the reproduction signal RF (EQ) and the binarized data DD from the path memory update unit 34.

The adaptive reference level generation circuit 35 in this case is provided with x low pass filters provided according to the number x of reference levels set corresponding to the PR class to be adopted. Then, the value of the reproduction signal RF (EQ) is distributed and input to the low pass filters in accordance with the pattern of the binarized data DD, and the value of the reproduction signal RF is averaged for each reference level. The result is output as the reference level data.

The reference level data adapted to the actual reproduction signal RF can be obtained in this way, whereby an appropriate value can be obtained as the branch metric calculated by the branch metric calculation unit 32 even in a case where an ideal reproduction signal RF (EQ) expected in the PR class cannot be obtained, and the reliability of the binarized data DD can be improved.

In a case where the signal quality evaluation unit 10 of the embodiment is used in combination with such an adaptive Viterbi detector, the internal reference level of the Viterbi detector changes according to an input signal, and as a result, the Euclidean distance at the time of detection changes.

In the signal evaluation technique disclosed in Japanese Patent No. 4622632, addition of an operation is required to maintain the accuracy (for the bit error operation) of the evaluation value in such a situation.

In contrast, in the case of the above-described signal quality evaluation unit 10, the change of the adaptive Viterbi is already incorporated at the time of the operation of the path selection margin (SAM) defined as the difference in metrics, and normalization with the Euclidean distance is not required in the subsequent operation. For this reason, combination with the adaptive Viterbi is possible without introducing a special operation, and an evaluation value with high accuracy can be generated with a simpler configuration.

<6. Conclusion and Modifications>

The signal quality evaluation unit 10 of the embodiment includes the merge error estimation unit 22 (first arithmetic unit) that obtains the estimated value (estimated path merge error rate spmER) of the path selection error rate on the basis of the distribution of the path metric difference between the maximum likelihood path Pa of each time, the maximum likelihood path being the detection path in the maximum likelihood decoding, and the second path Pb having the second highest likelihood in the PRML decoding system to perform partial response equalization and the maximum likelihood decoding for the reproduction signal of the bit information. Furthermore, the signal quality evaluation unit 10 includes the average value calculation unit 23 (second arithmetic unit) that obtains the average error bit number in erroneous detection from the bit difference number (path selection error bit number) between the maximum likelihood path Pa and the second path Pb at the time of path selection of each time in the maximum likelihood decoding. Furthermore, the signal quality evaluation unit 10 includes the evaluation value generation unit (the bit error estimation unit 24 and the conversion unit 25) that obtains the estimated bit error rate sbER from the estimated path merge error rate spmER as the arithmetic result by the merge error estimation unit 22 and the average error bit number η as the arithmetic result by the average value calculation unit 23, and generates the evaluation value d-MLSE according to the estimated bit error rate sbER.

According to such a configuration, the evaluation value is not calculated for some error patterns specified in advance, and the evaluation value covering all error patterns that are likely to occur is obtained. Signal evaluation with higher accuracy (having a high correlation with the actual error rate) becomes thus possible by simple operations. Since the error patterns are not particularly limited, the configuration is very effective for a reproduction system having various error patterns that are likely to occur.

Furthermore, since the configuration does not specify an error pattern, a pattern filter for determining an error pattern is unnecessary. Then, as measurement on processing, only the frequency counter of the distribution calculation unit 21 is required. Therefore, the configuration is not complicated. Especially, the circuit scale does not become larger as the constraint length becomes longer.

Furthermore, a distance operation is unnecessary in the process of calculating the estimated bit error rate sbER serving as the evaluation value of the signal quality, or the evaluation value d-MLSE that is the converted value. Therefore, the configuration can cope with any PR class.

In the signal quality evaluation unit 10 of the embodiment, the merge error estimation unit 22 (first arithmetic unit) obtains the estimated value (estimated path merge error rate spmER) of the path selection error rate from the normal distribution approximated to the distribution of the path metric difference (see FIG. 9).

The distribution of the path metric difference is superposition of a very large number of error patterns having different distances and is non-normal distribution. However, a portion close to zero can be relatively favorably approximated to the normal distribution. The path merge error rate (that is, the appearance frequency at which the path metric difference becomes less than 0) is estimated from this approximated normal distribution. As a result, the path merge error rate with high accuracy can be obtained by the simple operation technique.

In the signal quality evaluation unit 10 having the configuration illustrated in FIG. 11 in the embodiment, the average value calculation unit 23 (second arithmetic unit) obtains the average error bit number, using the bit difference number between the maximum likelihood path and the second path of the case where the value of the path metric difference between the maximum likelihood path and the second path becomes equal to or less than a predetermined threshold value.

The path metric difference (path selection margin: SAM value) and the bit difference number (path selection error bit number) are instantaneous values obtained for each sample. Generally, in a case where the path selection margin value (SAM value) is small, the path selection margin value can be regarded as a sample close to a detection error or a sample that has caused a detection error. As for the path selection error bit number, it is conceivable that a result closer to a behavior at the time of actual detection error can be obtained by obtaining an average value for samples close to a detection error. Therefore, an average path selection error number is obtained for samples equal to or less than a certain threshold value th with respect to the SAM value. As a result, the accuracy of the average error bit number is improved and improvement of the accuracy of the final evaluation value can also be expected.

The signal quality evaluation unit 10 of the embodiment generates and outputs the evaluation value d-MLSE obtained by converting the estimated bit error rate sbER into jitter.

By representing the evaluation value by jitter as described above, compatibility of the value with a conventional evaluation value can be secured, and incorporation of the signal quality evaluation unit 10 of the present embodiment into the reproduction system becomes easy.

Note that the estimated bit error rate sbER also has a property as the evaluation value. Therefore, the estimated bit error rate sbER may be output as the evaluation value in place of the evaluation value d-MLSE or together with the evaluation value d-MLSE.

The reproduction device 1 (see FIG. 1) of the embodiment includes a reproduction unit (2, 3, 4, 5, 6) that reproduces the reproduction signal of the bit information from the optical disk 90 (recording medium) and a decoding unit (the PR equalization unit 8 and the maximum likelihood decoding unit 9) that performs the PRML decoding processing by partial response equalization and maximum likelihood decoding for the reproduction signal to decode the binarized data DD. Then, the reproduction device 1 includes the signal quality evaluation unit 10 including the merge error estimation unit 22 (first arithmetic unit), the average value calculation unit 23 (second arithmetic unit), and the bit error estimation unit 24 and the conversion unit 25 (evaluation value generation unit).

With the configuration, a reproduction device capable of performing signal evaluation having a high correlation with the actual error rate by simple operations can be realized.

In the reproduction device 1 of the embodiment, as described in FIG. 12, in the maximum likelihood decoding unit 9, the adaptive Viterbi detector in which the reference level used for calculation of the branch metric is set to be variable according to the level of the reproduction signal may be used.

In the signal quality evaluation technique of the embodiment, the change of the adaptive Viterbi is already incorporated at the time of the operation of the path selection margin (SAM) defined as the metric difference, and normalization with the Euclidean distance is not required in the subsequent operation. Therefore, combination with the adaptive Viterbi without introducing special operations is possible. Therefore, an evaluation value with high accuracy can be obtained with a simpler configuration even in a case of using the adaptive Viterbi detector.

In the description of the embodiment, several PR classes such as PR (3, 6, 9, 13, 16, 17, 16, 13, 9, 6, 3) or the like have been cited. However, various PR classes and ISI can be adopted in the reproduction device 1 of the embodiment.

Furthermore, the technology of the present disclosure can be widely applied to decoding of bit information reproduced from a recording medium and decoding of transmitted bit information. The recording medium is not limited to an optical disk and any recording medium is assumed.

Note that the effects described in this specification are merely examples and are not limited, and other effects may be exhibited.

Note that the present technology can also have the following configurations.

(1) A signal quality evaluation device including:
a first arithmetic unit configured to obtain an estimated value of a path selection error rate on the basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information;
a second arithmetic unit configured to obtain an average error bit number in erroneous detection from a bit difference number between the maximum likelihood path and the second path at a time of path selection of each time in the maximum likelihood decoding; and
an evaluation value generation unit configured to obtain an estimated bit error rate from arithmetic results by the first arithmetic unit and the second arithmetic unit, and generate an evaluation value according to the estimated bit error rate.

(2) The signal quality evaluation device according to (1), in which
the first arithmetic unit obtains an estimated value of a path selection error rate from a normal distribution approximated to the distribution of a path metric difference.

(3) The signal quality evaluation device according to (1) or (2), in which
the second arithmetic unit obtains the average error bit number, using the bit difference number between the maximum likelihood path and the second path of a case where a value of the path metric difference between the maximum likelihood path and the second path is equal to or less than a predetermined threshold value.

(4) The signal quality evaluation device according to any one of (1) to (3), in which
the evaluation value generation unit generates the evaluation value obtained by converting the estimated bit error rate obtained from the arithmetic results of the first arithmetic unit and the second arithmetic units into jitter.

(5) A reproduction device including:
a reproduction unit configured to reproduce a reproduction signal of bit information from a recording medium;
a decoding unit configured to perform PRML decoding processing by partial response equalization and maximum likelihood decoding for the reproduction signal to decode binarized data;
a first arithmetic unit configured to obtain an estimated value of a path selection error rate on the basis of a distribution of a path metric difference between a maximum likelihood path of each time, the maximum likelihood path being a detection path in the maximum likelihood decoding, and a second path having a second highest likelihood;
a second arithmetic unit configured to obtain an average error bit number in erroneous detection from a bit difference number between the maximum likelihood path and the second path at a time of path selection of each time in the maximum likelihood decoding; and
an evaluation value generation unit configured to obtain an estimated bit error rate from arithmetic results by the first arithmetic unit and the second arithmetic unit, and generate an evaluation value according to the estimated bit error rate.

(6) The reproduction device according to (5), in which
the decoding unit performs the maximum likelihood decoding by an adaptive Viterbi detector in which a reference level used for calculation of a branch metric is variably set according to a level of the reproduction signal.

(7) A signal quality evaluation value generation method including:
a first arithmetic process of obtaining an estimated value of a path selection error rate on the basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information;
a second arithmetic process of obtaining an average error bit number in erroneous detection from a bit difference number between the maximum likelihood path and the second path at a time of path selection of each time in the maximum likelihood decoding; and
an evaluation value generation process of obtaining an estimated bit error rate from arithmetic results by the first arithmetic process and the second arithmetic process, and generating an evaluation value according to the estimated bit error rate.

REFERENCE SIGNS LIST

1 Reproduction device
8 PR equalization unit
9 Maximum likelihood decoding unit
10 Signal quality evaluation unit
21 Distribution calculation unit
22 Merge error estimation unit
23 Average value calculation unit
24 Bit error estimation unit
25 Conversion unit

The invention claimed is:

1. A signal quality evaluation device comprising:
a first arithmetic unit configured to obtain an estimated value of a path selection error rate on a basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information;

a second arithmetic unit configured to obtain an average error bit number in erroneous detection from a bit difference number between the maximum likelihood path and the second path at a time of path selection of each time in the maximum likelihood decoding; and an evaluation value generation unit configured to obtain an estimated bit error rate from arithmetic results by the first arithmetic unit and the second arithmetic unit, and generate an evaluation value according to the estimated bit error rate.

2. The signal quality evaluation device according to claim 1, wherein
the first arithmetic unit obtains an estimated value of a path selection error rate from a normal distribution approximated to the distribution of a path metric difference.

3. The signal quality evaluation device according to claim 1, wherein
the second arithmetic unit obtains the average error bit number, using the bit difference number between the maximum likelihood path and the second path of a case where a value of the path metric difference between the maximum likelihood path and the second path is equal to or less than a predetermined threshold value.

4. The signal quality evaluation device according to claim 1, wherein
the evaluation value generation unit generates the evaluation value obtained by converting the estimated bit error rate obtained from the arithmetic results of the first arithmetic unit and the second arithmetic units into jitter.

5. A reproduction device comprising:
a reproduction unit configured to reproduce a reproduction signal of bit information from a recording medium;
a decoding unit configured to perform PRML decoding processing by partial response equalization and maximum likelihood decoding for the reproduction signal to decode binarized data;
a first arithmetic unit configured to obtain an estimated value of a path selection error rate on a basis of a distribution of a path metric difference between a maximum likelihood path of each time, the maximum likelihood path being a detection path in the maximum likelihood decoding, and a second path having a second highest likelihood;
a second arithmetic unit configured to obtain an average error bit number in erroneous detection from a bit difference number between the maximum likelihood path and the second path at a time of path selection of each time in the maximum likelihood decoding; and
an evaluation value generation unit configured to obtain an estimated bit error rate from arithmetic results by the first arithmetic unit and the second arithmetic unit, and generate an evaluation value according to the estimated bit error rate.

6. The reproduction device according to claim 5, wherein
the decoding unit performs the maximum likelihood decoding by an adaptive Viterbi detector in which a reference level used for calculation of a branch metric is variably set according to a level of the reproduction signal.

7. A signal quality evaluation value generation method comprising:
a first arithmetic process of obtaining an estimated value of a path selection error rate on a basis of a distribution of a path metric difference between a maximum likelihood path of each time, the maximum likelihood path being a detection path in maximum likelihood decoding, and a second path having a second highest likelihood in a PRML decoding system to perform partial response equalization and the maximum likelihood decoding for a reproduction signal of bit information;
a second arithmetic process of obtaining an average error bit number in erroneous detection from a bit difference number between the maximum likelihood path and the second path at a time of path selection of each time in the maximum likelihood decoding; and
an evaluation value generation process of obtaining an estimated bit error rate from arithmetic results by the first arithmetic process and the second arithmetic process, and generating an evaluation value according to the estimated bit error rate.

* * * * *